(12) United States Patent
Whitefield et al.

(10) Patent No.: US 7,074,710 B2
(45) Date of Patent: Jul. 11, 2006

(54) METHOD OF WAFER PATTERNING FOR REDUCING EDGE EXCLUSION ZONE

(75) Inventors: Bruce Whitefield, Camas, WA (US); David Ambercrombie, Gresham, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/980,945

(22) Filed: Nov. 3, 2004

(65) Prior Publication Data

US 2006/0094246 A1  May 4, 2006

(51) Int. Cl.
*H01L 21/4763* (2006.01)

(52) U.S. Cl. .................. 438/626; 438/107; 438/113; 438/633; 438/926; 257/629

(58) Field of Classification Search ................. 438/626
See application file for complete search history.

(56) References Cited

U.S. PATENT DOCUMENTS

| 4,899,195 | A | * | 2/1990 | Gotoh ........................ 355/77 |
| 5,310,626 | A | * | 5/1994 | Fernandes et al. .......... 430/327 |
| 6,268,090 | B1 | * | 7/2001 | Matsubara et al. ............ 430/5 |
| 6,614,507 | B1 | * | 9/2003 | Young et al. ................. 355/67 |
| 6,707,535 | B1 | * | 3/2004 | Sato et al. ..................... 355/53 |
| 6,812,550 | B1 | * | 11/2004 | En et al. ..................... 257/629 |
| 6,867,842 | B1 | * | 3/2005 | Arao ............................ 355/30 |
| 2001/0033975 | A1 | * | 10/2001 | Chung et al. .................. 430/5 |
| 2001/0049179 | A1 | * | 12/2001 | Mori .......................... 438/461 |
| 2002/0019091 | A1 | * | 2/2002 | Kim .......................... 438/239 |
| 2004/0253810 | A1 | * | 12/2004 | Wang et al. ................ 438/633 |
| 2005/0110065 | A1 | * | 5/2005 | Uchiyama et al. .......... 257/296 |

* cited by examiner

*Primary Examiner*—Carl Whitehead, Jr.
*Assistant Examiner*—Colleen E. Rodgers
(74) *Attorney, Agent, or Firm*—Eric J. Whitesell

(57) ABSTRACT

A method includes steps of: (a) providing a wafer on which a film has been deposited; (b) exposing an annular area in an edge exclusion zone of the wafer to radiation having a wavelength suitable for patterning the film in the annular area; and (c) modulating the radiation while exposing the annular area to form a pattern in the film in the annular area.

9 Claims, 6 Drawing Sheets

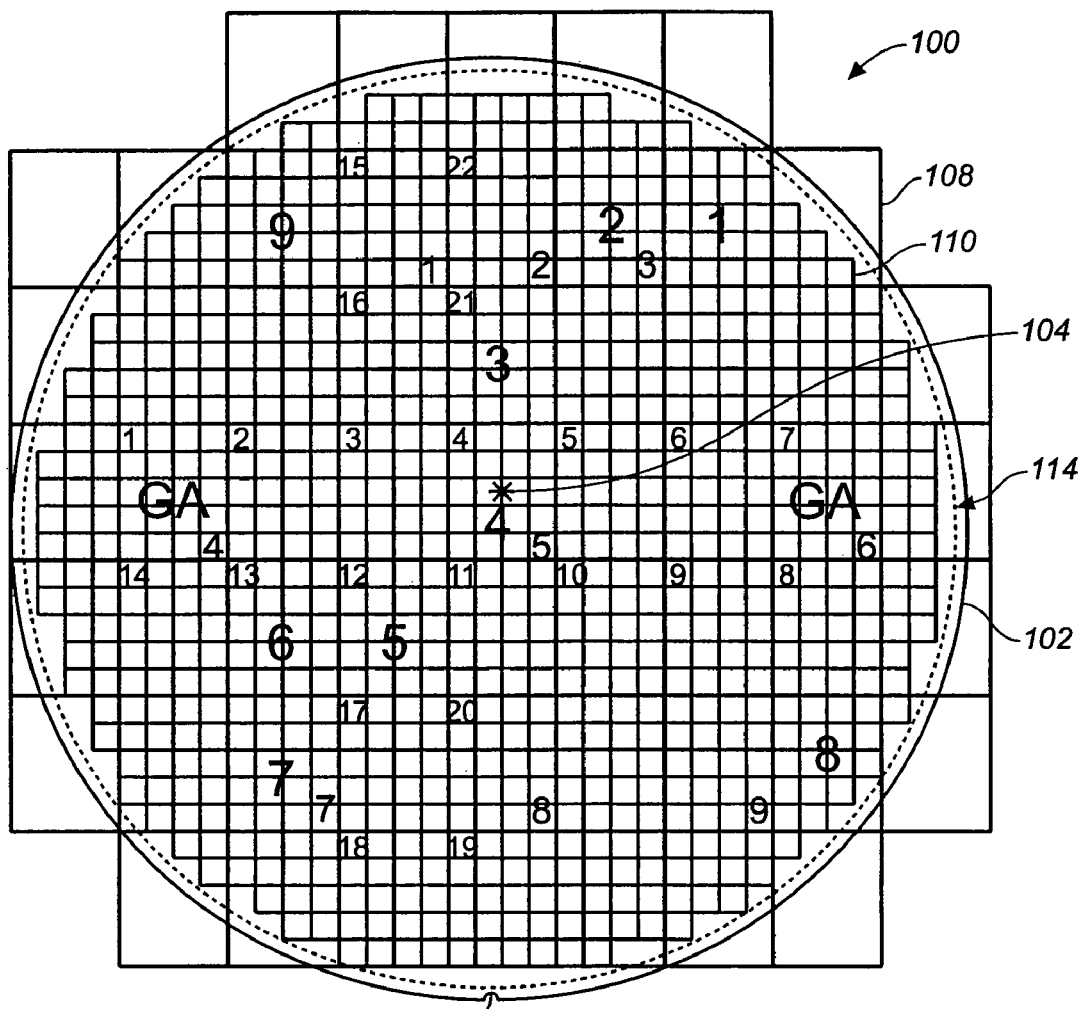
FIG._1 (PRIOR ART)
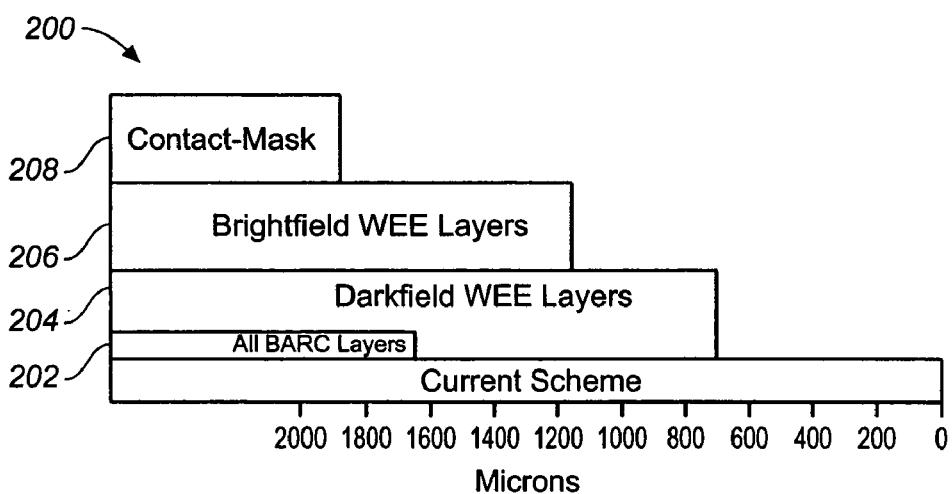
FIG._2 (PRIOR ART)

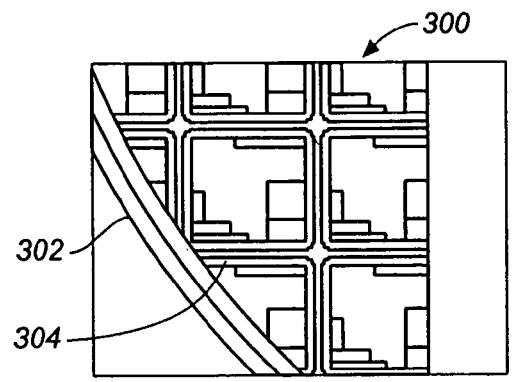
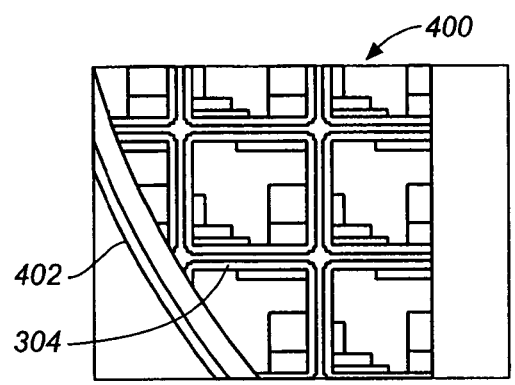
FIG._3 (PRIOR ART)  FIG._4 (PRIOR ART)
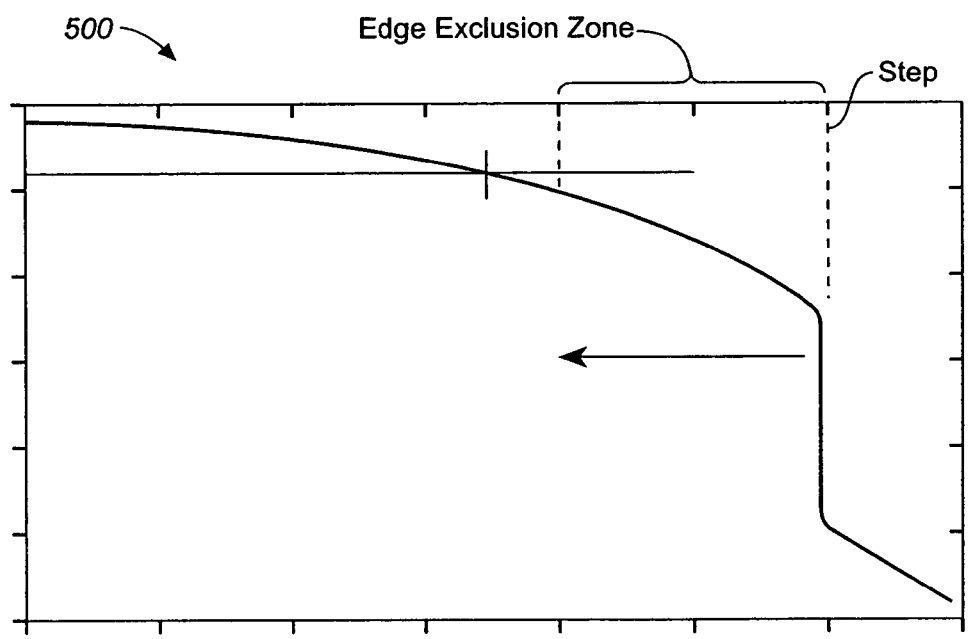
FIG._5 (PRIOR ART)

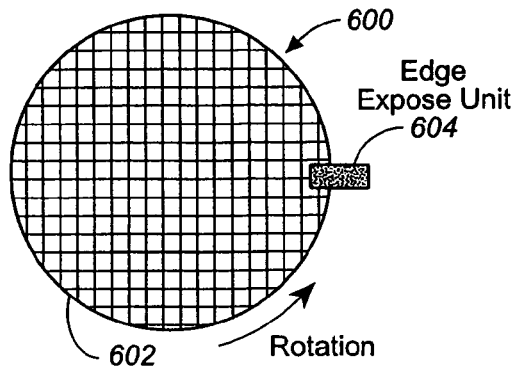
FIG._6
(PRIOR ART)
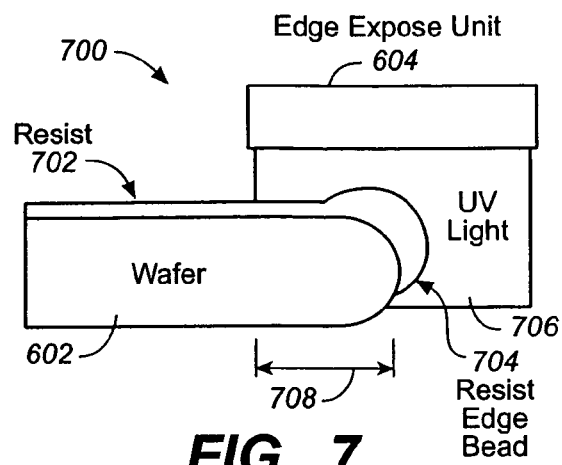
FIG._7
(PRIOR ART)
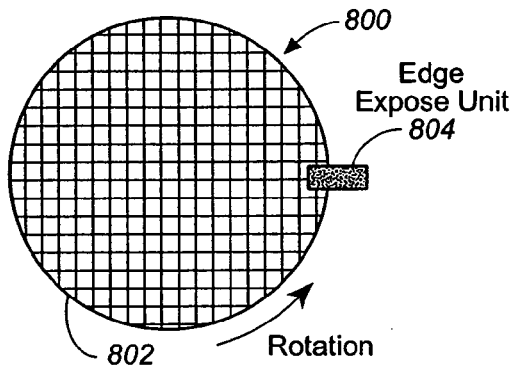
FIG._8
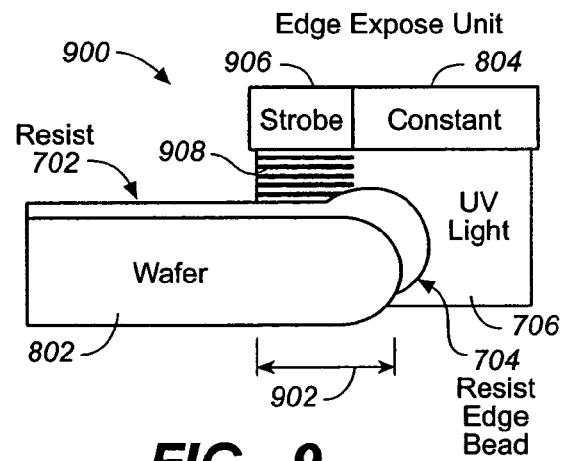
FIG._9
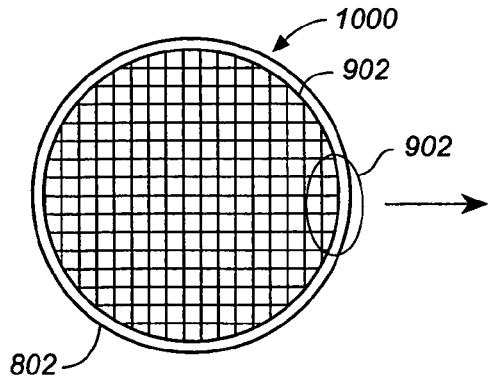
FIG._10
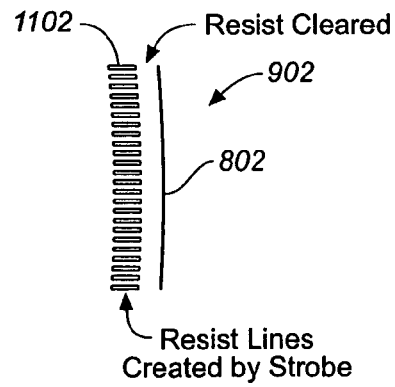
FIG._11

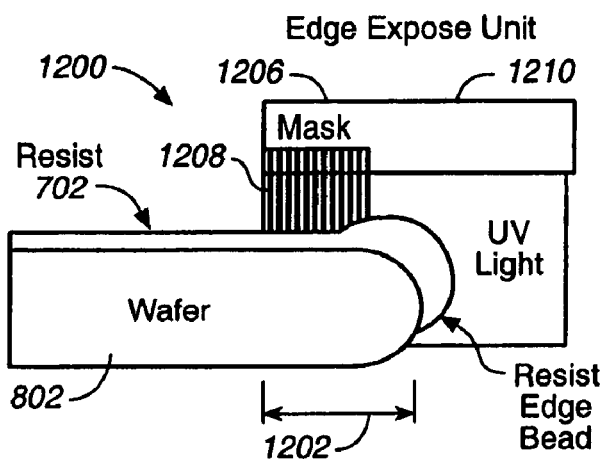
*FIG._12*
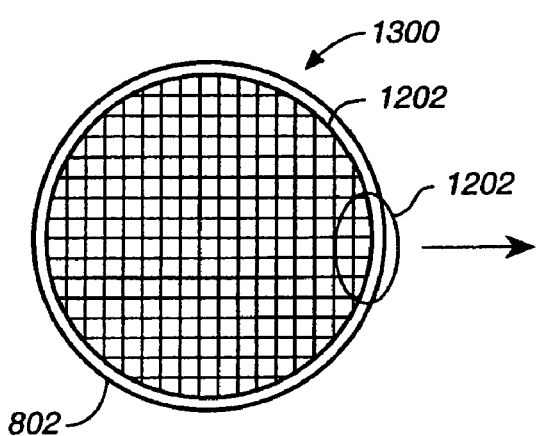
*FIG._13*
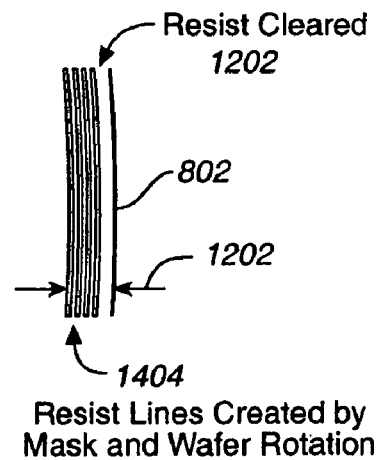
*FIG._14*
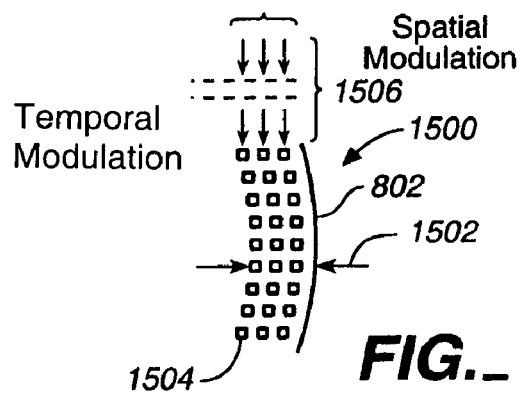
*FIG._15*

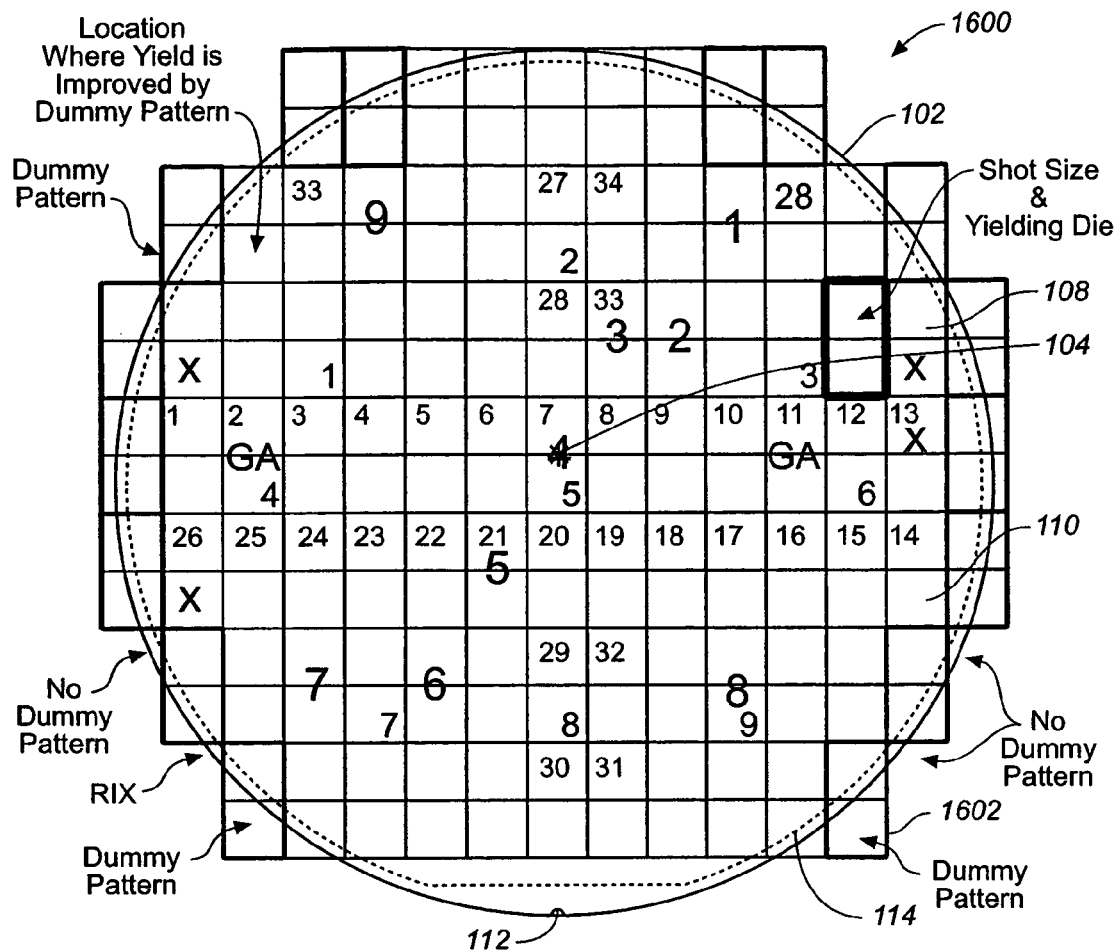
FIG._16
*(PRIOR ART)*

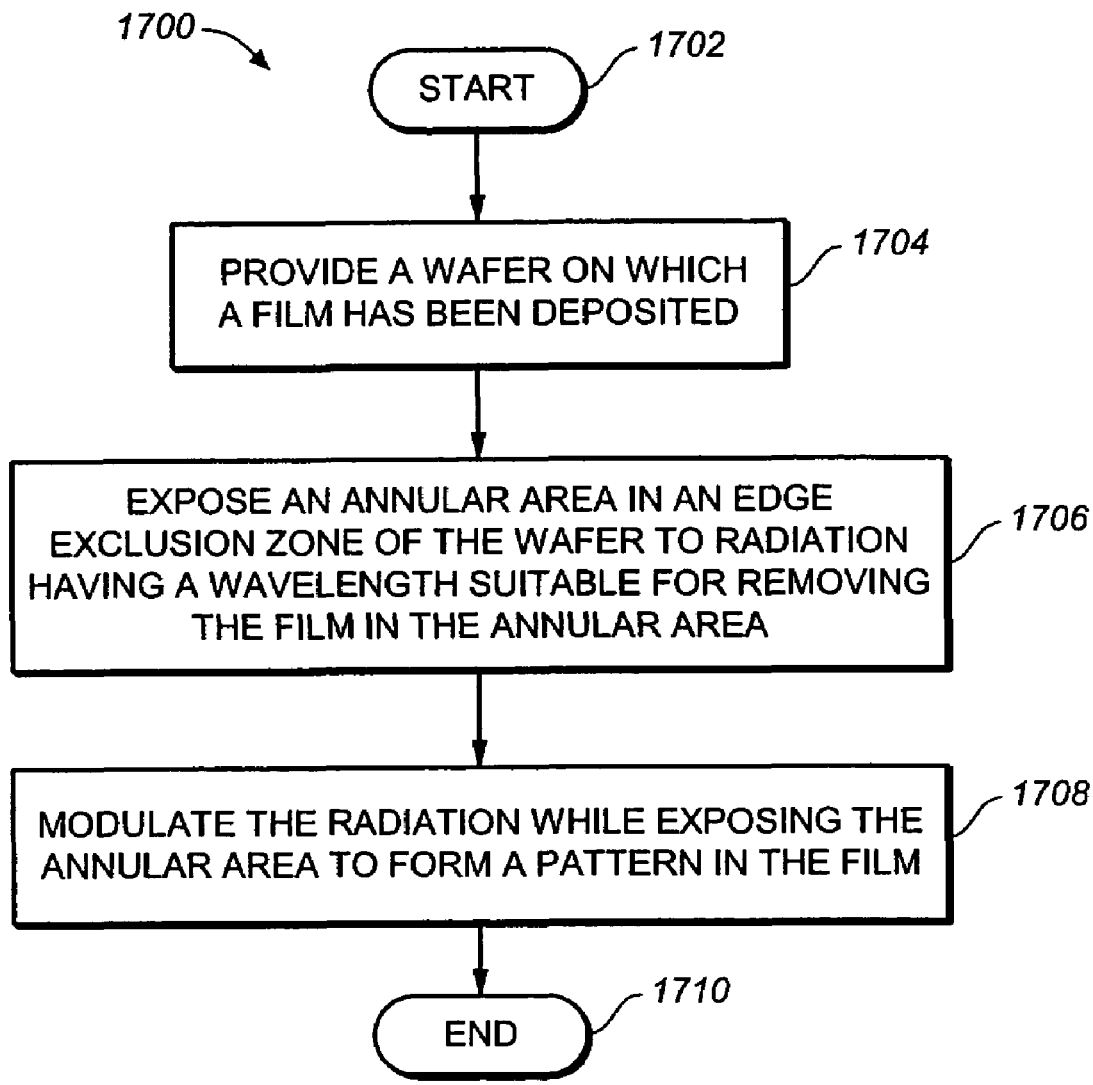
FIG._17

METHOD OF WAFER PATTERNING FOR REDUCING EDGE EXCLUSION ZONE

BACKGROUND OF THE INVENTION

1. Field of the Invention

The present invention is directed to methods of manufacturing integrated circuits. More specifically, but without limitation thereto, the present invention is directed to a method of optimizing die yield in a silicon wafer.

2. Description of the Prior Art

In the manufacture of integrated circuit devices, a silicon wafer is typically partitioned into die or dice each having an identical arrangement of semiconductor structures. The die are formed on the silicon wafer by a photolithography tool, called a stepper. The stepper prints the die in groups, called shots, on the surface of the silicon wafer. Photo resist films are deposited and etched on the wafer to expose specific areas of the die to various manufacturing processes. The removal of the buildup of the resist films at the edge of the wafer result in an unusable space on the edge of the wafer called the edge exclusion zone. The number of die formed in the usable area of the silicon wafer that perform satisfactorily to design specifications is called the wafer yield.

SUMMARY OF THE INVENTION

In one embodiment, an apparatus includes:

an edge expose unit for exposing an annular area in an edge exclusion zone of a wafer to radiation having a wavelength suitable for removing a film from the wafer in the annular area; and a radiation modulator coupled to the edge expose unit for modulating the radiation to pattern the film in the annular area.

In another embodiment, a method includes steps of:

(a) providing a wafer on which a film has been deposited;

(b) exposing an annular area in an edge exclusion zone of the wafer to radiation having a wavelength suitable for patterning the film in the annular area; and (c) modulating the radiation while exposing the annular area to form a pattern in the film in the annular area.

BRIEF DESCRIPTION OF THE DRAWINGS

The embodiments described herein are illustrated by way of example and not limitation in the accompanying figures, in which like references indicate similar elements throughout the several views of the drawings, and in which:

FIG. 1 illustrates a wafer layout of the prior art;

FIG. 2 illustrates a typical wafer edge exposure plan for the wafer layout of FIG. 1;

FIG. 3 illustrates a top view of die clipping for a wafer edge setting of 3 millimeters;

FIG. 4 illustrates a top view of die clipping for a wafer edge setting of 2 millimeters;

FIG. 5 illustrates a plot of wafer planarization of the wafer layout of FIG. 1 after a chemical mechanical process;

FIG. 6 illustrates a top view of a wafer edge exposure apparatus of the prior art;

FIG. 7 illustrates a side view of the wafer edge exposure apparatus of FIG. 6;

FIG. 8 illustrates a top view of an improved wafer edge exposure apparatus;

FIG. 9 illustrates a side view of the wafer edge exposure apparatus of FIG. 8 with temporal radiation modulation;

FIG. 10 illustrates a top view of a wafer layout generated by the edge expose unit of FIGS. 8 and 9;

FIG. 11 illustrates a magnified view of the edge exclusion zone in the wafer layout of FIG. 10;

FIG. 12 illustrates a side view of the wafer edge exposure apparatus of FIG. 8 with spatial radiation modulation;

FIG. 13 illustrates a top view of a wafer layout generated by the wafer edge exposure apparatus of FIG. 12;

FIG. 14 illustrates a magnified view of the edge zone in the wafer layout of FIG. 13;

FIG. 15 illustrates a magnified view of an edge exclusion zone using an edge expose unit with both temporal and spatial modulation;

FIG. 16 illustrates a top view of a wafer layout of the prior art with dummy shots; and FIG. 17 illustrates a flow chart of a method of wafer patterning to reduce the edge exclusion zone.

Elements in the figures are illustrated for simplicity and clarity and have not necessarily been drawn to scale. For example, the dimensions of some of the elements in the figures may be exaggerated relative to other elements to help to improve understanding of the following description of the illustrated embodiments.

DESCRIPTION OF THE ILLUSTRATED EMBODIMENTS

Achieving the maximum usable wafer area and the highest wafer yield is critical to cost effective manufacturing of integrated circuits. Typically, a stack of etch resist films called an edge bead builds up on the wafer edge. The edge bead causes defects in the die that are located near the wafer edge. Previous methods for removing the edge bead include a combination of solvent dispense edge bead remover (EBR) and a wafer edge expose (WEE) process. Recently, additional techniques such as wet edge etching and edge scrub processes have been implemented as well.

The previous methods described above for removing or controlling films deposited on wafers to reduce the number of defective die require some space at the edge of the wafer. Initially, the industry standard for the non-yielding zone at the edge of the wafer, called the edge exclusion zone, was four millimeters or more. As improved methods for controlling films became available, it has been possible to reduce the edge exclusion zone to about three millimeters and even two millimeters. A proposed industry standard has called for a further reduction of the edge exclusion zone to one millimeter by 2006.

FIG. 1 illustrates a wafer layout 100 of the prior art. Shown in FIG. 1 are a silicon wafer 102, a wafer center 104, shots 108, completely patterned die 110, a wafer notch 112, and an edge exclusion zone 114.

The wafer layout software generates a shot map of the die locations on the wafer according to well known techniques. The shot map is then overlaid on the silicon wafer. In this example, each of the shots 108 contains up to 20 die 110 arranged in a 4×5 rectangle.

Because die that extend into the edge exclusion zone 114 will be only partially patterned and will not yield, the shots 108 near the edge of the wafer 102 contain fewer completely patterned die 110 than the total number of 20 in the available shot capacity. The edge exclusion radius that is used to determine the wafer layout 100 and the number of usable die sites on the wafer 102, also known as gross die per wafer, is not actually the radius at which the films constituting the edge bead are removed. This is because the physical edge of the films must be closer to the edge of the wafer 102 than the die 110 to avoid defects in the die 110 that are closest to the radius of the edge exclusion zone. In addition, certain films may not be allowed to overlap an adjacent film in the film stack to avoid particle defects, so that some films in the stack have a larger edge radius in the edge exclusion zone than the films above.

FIG. 2 illustrates a typical wafer edge exposure plan 200 for the wafer layout of FIG. 1. Shown in FIG. 2 are BARC layers 202, dark field wafer edge expose layers 204, light field wafer edge expose layers 206, and a contact mask 208.

The Backside Anti-Reflective Coating (BARC) layers 202 are an organic coating used to reduce interference from reflections during optical lithography.

The dark field wafer edge expose layers 204 are semiconductor layers that have only a very little pattern. The chrome mask used has only a small opening that allows light to pass through, giving the appearance of dark layers.

The light field wafer edge expose layers 206 are semiconductor layers that are mostly patterned lines. The chrome mask used has a large number of openings that allow light to pass through, giving the appearance of light layers.

The contact mask 208 is used to pattern the lower layers during photolithography.

Control of the edge removal settings with currently available equipment is typically about +/−0.2 millimeters. To ensure that the BARC layers 202, the dark field wafer edge expose layers 204, the bright field wafer edge expose layers 206, and the contact mask 208 do not overlap, each edge radius setting must be separated by at least 0.4 millimeters with an additional 0.4 millimeters to allow for the curvature of the wafer edge. In this example, at least four non-overlapping settings are needed, which adds up to a minimum of at least 1.6 millimeters required for the physical edge settings.

The value of reducing the edge exclusion zone by one millimeter is considerable, as illustrated below.

FIG. 3 illustrates a top view 300 of die clipping for a wafer edge setting of 3 millimeters. Shown in FIG. 3 are a 3 millimeter wafer edge 302 and a die 304.

As shown in FIG. 3, the 3 millimeter wafer edge 302 results in clipping the corner of the die 304, rendering it unusable.

FIG. 4 illustrates a top view 400 of die clipping for a wafer edge setting of 2 millimeters. Shown in FIG. 4 are a 2 millimeter wafer edge 402 and a die 304.

As shown in FIG. 4, the 2 millimeter wafer edge 402 avoids clipping the corner of the die 304, rendering it usable. The difference between a 3 millimeter edge setting and a 2 millimeter edge setting may be worth an additional 10 to 30 die per wafer, depending on the die size and the wafer diameter. The increase in gross die per wafer represents a significant financial value for a typical wafer fabrication facility.

Removing edge films by removing the etch resist and exposing the films to an etch process or by direct edge film etching improves wafer yields by avoiding stacking of films that have incompatible coefficients of thermal expansion or poor adhesion with other films. In relatively large areas of films such as in the edge exclusion zone, the films are more susceptible to particle flaking during processes performed at high temperatures and/or in a vacuum, resulting in particle defects.

A consequence of removing the edge films is the creation of a sharp step at the edge exclusion zone. This step adversely affects the chemical mechanical process (CMP) that forms a uniformly plane surface across the wafer. Each chemical mechanical process has a characteristic planarization length, that is, the distance from the edge of a sharp step before the desired thickness and planarity of the wafer is achieved. The sharp step at the edge exclusion zone creates a ring of poor planarization that extends about one millimeter from the step.

FIG. 5 illustrates a plot 500 of wafer planarization of the wafer layout of FIG. 1 after a chemical mechanical process. In FIG. 5, the net effect of the edge steps interacting with the chemical mechanical process is that the best possible edge setting of 1.6 millimeters in the example of FIG. 2 plus one millimeter for the chemical mechanical processing planarization length results in a minimum realizable edge exclusion zone of 2.6 millimeters.

FIG. 6 illustrates a top view 600 of a wafer edge exposure apparatus of the prior art. Shown in FIG. 6 are a wafer 602 and an edge expose unit 604.

In FIG. 6, the wafer 602 is rotated under the edge expose unit 604 to expose the resist film around the edge of the wafer 602 to radiation having a suitable wavelength for removing the resist, for example, ultraviolet light. Typically, the wafer 602 is mounted on a rotating table. The exposed resist is then removed according to well known processes for developing and rinsing away the resist film.

FIG. 7 illustrates a side view 700 of the wafer edge exposure apparatus of FIG. 6. Shown in FIG. 7 are a wafer 602, an edge expose unit 604, a resist film 702, an edge bead 704, ultraviolet radiation 706, and an edge exclusion zone 708.

In FIG. 7, a narrow line extending through the edge exclusion zone 708 is exposed to the ultraviolet radiation 706 as the wafer 602 is rotated under the edge expose unit 604. The rotation of the wafer 602 results in the exposure of the annular edge exclusion zone 708. The exposed resist is then removed from the edge exclusion zone 708 by, for example, a solvent rinse.

To achieve the goal of a one millimeter edge exclusion zone, control of the edge film removal processes would have to be improved from +/−0.2 millimeters to +/−0.1 millimeters, and the chemical mechanical processing planarization length would have to be reduced from one millimeter to 0.2 millimeter. Another way to reduce the edge exclusion zone is to modify a standard wafer edge exposure apparatus to create a dummy pattern in the edge exclusion zone so that the planarization length may be shortened to the stepped edges of the film layers.

In one embodiment, an apparatus for wafer patterning to reduce the size of the edge exclusion zone includes:

an edge expose unit for exposing an annular area in an edge zone of a wafer to radiation having a wavelength suitable for removing a film from the wafer in the annular area; and a radiation modulator coupled to the edge expose unit for modulating the radiation to pattern the film in the annular area.

To avoid the abruptness of the stepped layers following the bare edge of the edge exclusion zone 708 that adversely affects the chemical mechanical processing, a dummy pattern may be created in the edge exclusion zone as follows.

FIG. 8 illustrates a top view 800 of an improved wafer edge exposure apparatus. Shown in FIG. 800 are a wafer 802 and an edge expose unit 804.

The wafer 802 may be rotated under the edge expose unit 804 according to the same well known techniques used in the prior art for the wafer edge exposure apparatus of FIG. 6. Alternatively, the edge expose unit 804 may rotate around the wafer 802 according to well known mechanical techniques.

FIG. 9 illustrates a side view 900 of the wafer edge exposure apparatus of FIG. 8 with temporal radiation modulation. Shown in FIG. 9 are a resist film 702, an edge bead 704, ultraviolet radiation 706, a wafer 802, an edge expose unit 804, an edge exclusion zone 902, a radiation modulator 906, and temporally modulated ultraviolet radiation 908.

In FIG. 9, the edge bead 704 is exposed to the constant beam of ultraviolet radiation 706, for example, in the same manner as in FIG. 7. In the edge exclusion zone 902, however, the radiation modulator 906 generates a pattern of lines, for example, by an electronic strobe or a rotating shutter that is synchronized with the rotation of the wafer 802.

FIG. 10 illustrates a top view 1000 of a wafer layout generated by the edge expose unit 804 of FIGS. 8 and 9. Shown in FIG. 10 are a wafer 802 and an edge exclusion zone 902. The temporally modulated ultraviolet radiation 908 in the edge exclusion zone 902 results in a pattern of lines that may be used for planarization by chemical mechanical process.

FIG. 11 illustrates a magnified top view of the edge exclusion zone 902 in the wafer layout of FIG. 10. Shown in FIG. 11 are a wafer 802, an edge exclusion zone 902, and resist lines 1102.

In FIG. 11, the edge exclusion zone 902 of the wafer 802 has been exposed to the temporally modulated ultraviolet radiation 908, and the exposed resist has been removed, leaving the pattern of radial resist lines 1102 between the edge of the wafer 802 where the edge bead 704 was removed and the usable portion of the wafer 802.

In another embodiment, the wafer edge exposure apparatus of FIG. 8 may be used to generate a pattern of circular resist lines.

FIG. 12 illustrates a side view 1200 of the wafer edge exposure apparatus of FIG. 8 with spatial radiation modulation. Shown in FIG. 12 are a resist film 702, an edge bead 704, ultraviolet radiation 706, a wafer 802, an edge exclusion zone 1202, a radiation modulator 1206, spatially modulated ultraviolet radiation 1208, and an edge expose unit 1210.

In FIG. 12, the edge bead 704 is exposed to the constant beam of ultraviolet radiation 706, for example, in the same manner as in FIG. 9. In the edge exclusion zone 1202, however, the radiation modulator 1206 generates a pattern of resist circles as the wafer 802 is rotated. In this example, the radiation modulator 1206 includes a mask that alternately passes and blocks the spatially modulated ultraviolet radiation 1208 from the edge expose unit 1210.

FIG. 13 illustrates a top view 1300 of a wafer layout generated by the edge expose unit 1210 of FIG. 12. Shown in FIG. 13 are a wafer 802, and an edge exclusion zone 1202. The spatially modulated ultraviolet radiation 1208 in the edge exclusion zone 1202 results in a pattern of resist circles that may be used for planarization by a standard chemical mechanical process.

FIG. 14 illustrates a magnified top view of the edge exclusion zone 1202 in the wafer layout of FIG. 13. Shown in FIG. 14 are a wafer 802, an edge exclusion zone 1202, and resist circles 1402.

In FIG. 14, the edge exclusion zone 1202 of the wafer 802 has been exposed to the spatially modulated ultraviolet radiation 1208, and the exposed resist has been removed, leaving the pattern of resist circles 1402 between the edge of the wafer 802 where the edge bead 704 was removed and the usable portion of the wafer 802.

In another embodiment, both spatial and temporal radiation modulation may be used to generate a checkerboard resist pattern in the edge exclusion zone.

FIG. 15 illustrates a magnified top view 1500 of an edge exclusion zone using an edge expose unit with both temporal and spatial modulation. Shown in FIG. 15 are a wafer 802, an edge exclusion zone 1502, a resist pattern 1504, and temporally and spatially modulated ultraviolet radiation 1506.

In FIG. 15, the edge exclusion zone 1202 of the wafer 802 has been exposed to the temporally and spatially modulated ultraviolet radiation 1506, and the exposed resist has been removed, leaving the checkerboard resist pattern 1504 between the edge of the wafer 802 where the edge bead 704 was removed and the usable portion of the wafer 802. Other patterns for populating the edge exclusion zone using temporal and spatial modulation of radiation from the edge expose unit and other types of radiation suitable for patterning wafers may be used to practice various embodiments within the scope of the appended claims.

An advantage of the apparatus for wafer patterning to reduce the size of the edge exclusion zone described above is that patterning the films in the edge exclusion zone often relieves the stress between film layers that may contribute to particle defects. Also, patterning the films in the edge exclusion zone may enable other strategies for edge film control that require less space on the edge of the wafer.

Another advantage of the apparatus for wafer patterning to reduce the size of the edge exclusion zone described above is that the practice of placing dummy exposures around the edge of a wafer to improve the chemical mechanical process may be avoided, thereby reducing the usage time required from highly expensive photolithography equipment for dummy shots.

FIG. 16 illustrates a top view 1600 of a wafer layout of the prior art with dummy shots. Shown in FIG. 16 are a silicon wafer 102, a wafer center 104, shots 108, die 110, a wafer notch 112, an edge exclusion zone 114, and dummy shots 1602.

In FIG. 16, there are 16 dummy shots 1602 and 59 shots 108. The dummy shots 1602 are included around the edge of the wafer 102 to provide a resist pattern that extends to the edge exclusion zone 114, thereby ensuring that yieldable planarization is achieved for the die 110 that lie inside the usable wafer area. Although the dummy shots 1602 constitute 21 percent of the total shots required from the photolithography equipment, the dummy shots 1602 do not directly produce usable die, because a portion of the die inside the dummy shots 1602 overlap the edge exclusion zone 114. By using the wafer patterning apparatus described above to achieve yieldable planarization for the usable die 110 that lie near the edge of the wafer 102 instead of the dummy shots 1602, a substantial savings in production time and cost may be achieved.

In another embodiment, a method of wafer patterning to reduce the size of the edge exclusion zone includes steps of:

(a) providing a wafer on which a film has been deposited;

(b) exposing an annular area in an edge exclusion zone of the wafer to radiation having a wavelength suitable for patterning the film in the annular area; and (c) modulating the radiation while exposing the annular area to form a pattern in the film in the annular area.

FIG. 17 illustrates a flow chart of a method of wafer patterning to reduce the edge exclusion zone.

Step 1702 is the entry point of the flow chart 1700.

In step 1704, a wafer is provided on which a film has been deposited. The wafer may be, for example, a silicon wafer used for the production of integrated circuit die. The film may be, for example, a photo resist film used in conjunction with photolithography equipment to mask specific areas of the wafer during various processing steps of the die.

In step 1706, an annular area in an edge exclusion zone of the wafer is exposed to radiation having a wavelength suitable for removing the film in the annular area. An example of a radiation having a suitable wavelength is ultraviolet light.

In step 1708, the radiation is modulated while exposing the annular area to form a pattern in the film in the annular area. The modulation may be, for example, a temporal modulation produced by a strobe or a rotating shutter that produces a pattern of radial lines. Alternatively, a spatial modulation may be used to produce a pattern of circles concentric with the center of the wafer, and a combination of temporal and spatial modulation may be used to produce a checkerboard pattern. After exposing the annular area in the edge exclusion zone to form the pattern, the pattern is developed according to well known techniques to remove the portion of the film in the edge exclusion zone that is not included in the pattern.

Step 1710 is the exit point of the flow chart 1700.

Although the method illustrated by the flowchart description above is described and shown with reference to specific steps performed in a specific order, these steps may be combined, sub-divided, or reordered without departing from the scope of the claims. Unless specifically indicated herein, the order and grouping of steps is not a limitation of other embodiments that may lie within the scope of the claims.

The exemplary embodiments described above assume that a positive resist is used to remove the exposed areas from the edge exclusion zone to form the pattern. The same method may be used with negative resist, except that the unexposed areas are removed from the edge exclusion zone to form the pattern. Other techniques for exposing resist such as electron beam or laser based direct write may be used to pattern the edge exclusion zone to practice other embodiments within the scope of the appended claims.

The specific embodiments and applications thereof do not preclude modifications and variations made thereto by those skilled in the art within the scope of the following claims.

What is claimed is:

1. A method comprising steps of:
   (a) providing a wafer on which a film has been deposited;
   (b) exposing an annular area in an edge exclusion zone of the wafer to radiation having a wavelength suitable for patterning the film in the annular area; and
   (c) modulating the radiation while exposing the annular area to form a pattern in the film in the annular area.

2. The method of claim 1 wherein the film is a photo resist film.

3. The method of claim 1 wherein step (c) comprises at least one of spatial modulation and temporal modulation.

4. The method of claim 3 wherein step (c) comprises creating a pattern of circles.

5. The method of claim 3 wherein step (c) comprises creating a pattern of lines.

6. The method of claim 1 wherein step (b) comprises rotating the wafer.

7. The method of claim 1 wherein step (b) comprises rotating a source of the radiation around the wafer.

8. The method of claim 1 wherein step (b) comprises exposing the annular area to ultraviolet radiation.

9. The method of claim 1 further comprising a step of developing the exposed annular area to remove a portion of the film that is not included in the pattern.

* * * * *

UNITED STATES PATENT AND TRADEMARK OFFICE
CERTIFICATE OF CORRECTION

PATENT NO. : 7,074,710 B2 Page 1 of 1
APPLICATION NO. : 10/980945
DATED : July 11, 2006
INVENTOR(S) : Bruce Whitefield and David Abercrombie It is certified that error appears in the above-identified patent and that said Letters Patent is hereby corrected as shown below:

Title page, item (75), line 2, change "Ambercrombie" to --Abercrombie--.

Signed and Sealed this

Fifth Day of September, 2006

JON W. DUDAS
*Director of the United States Patent and Trademark Office*